United States Patent
Kuo et al.

(10) Patent No.: US 7,642,816 B2
(45) Date of Patent: Jan. 5, 2010

(54) TRANSCONDUCTOR

(75) Inventors: Ming-Ching Kuo, Chiayi County (TW); Pei-Ling Tsai, Hsinchu (TW); Chih-Hung Chen, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 89 days.

(21) Appl. No.: 11/907,151

(22) Filed: Oct. 10, 2007

(65) Prior Publication Data

US 2009/0096490 A1   Apr. 16, 2009

(51) Int. Cl.
*H02M 11/00* (2006.01)
(52) U.S. Cl. .............. 327/103; 327/310; 327/313; 327/551; 330/261; 330/296
(58) Field of Classification Search .......... 327/103, 327/310, 313, 389, 391, 551, 553, 26, 27, 327/73; 330/253, 261, 278, 296, 311
See application file for complete search history.

(56) References Cited

U.S. PATENT DOCUMENTS

| | | | |
|---|---|---|---|
| 3,854,101 A | 12/1974 | Muramatsu | |
| 6,496,067 B1 * | 12/2002 | Behzad et al. | 330/261 |
| 6,542,019 B1 | 4/2003 | Lim et al. | |
| 6,650,883 B1 | 11/2003 | Stephane et al. | |
| 7,071,785 B2 * | 7/2006 | Behzad | 330/311 |
| 7,107,025 B2 | 9/2006 | Khorram | |
| 2004/0251947 A1 | 12/2004 | Wang | |

* cited by examiner

*Primary Examiner*—An T Luu
(74) *Attorney, Agent, or Firm*—Finnegan Henderson Farabow Garrett & Dunner LLP (57) ABSTRACT

A transconductor to convert an input voltage to an output current, includes: a primary transconductance stage to provide the output current from the input voltage and a driving current; an adaptive transconductance stage coupled in series with the primary transconductance stage to generate the driving current from the input voltage; and a bias circuit coupled to provide a primary bias voltage to the primary transconductance stage and an adaptive bias voltage to the adaptive transconductance stage.

20 Claims, 11 Drawing Sheets

TRANSCONDUCTOR

FIELD OF THE INVENTION

This invention pertains in general to analog circuitry and, more particularly, to transconductors.

BACKGROUND OF THE INVENTION

Interest in radio frequency integrated circuits (RFICs) for wireless communications in the 2 GHz frequency range has grown tremendously. An analog circuit in front-end transmitters and receivers in RFICs is a mixer that provides signal frequency translation from a radio frequency (RF) to an intermediate frequency (IF) or from an IF to an RF. The mixer usually includes a transconductance stage that converts its input voltage signals to output current signals and a core stage that mixes the output current signals with local oscillator (LO) signals.

Distortion in the transconductance stage is a consideration in the design of the mixer. It is desired to enhance linearity of the transconductance stage to improve linearity of the mixer. In addition to the mixer, other analog circuits, such as low noise amplifiers (LNAs) and filters in a communication system, may also include a transconductance stage. Conventionally the transconductance stage of those analog circuits may be realized with a differential pair circuit that converts its input voltage signals to output current signals. By improving linearity of the transconductance stage, or transconductor, linearity of the mixers, LNAs, and filters in the communication system may be improved.

Figure 1:
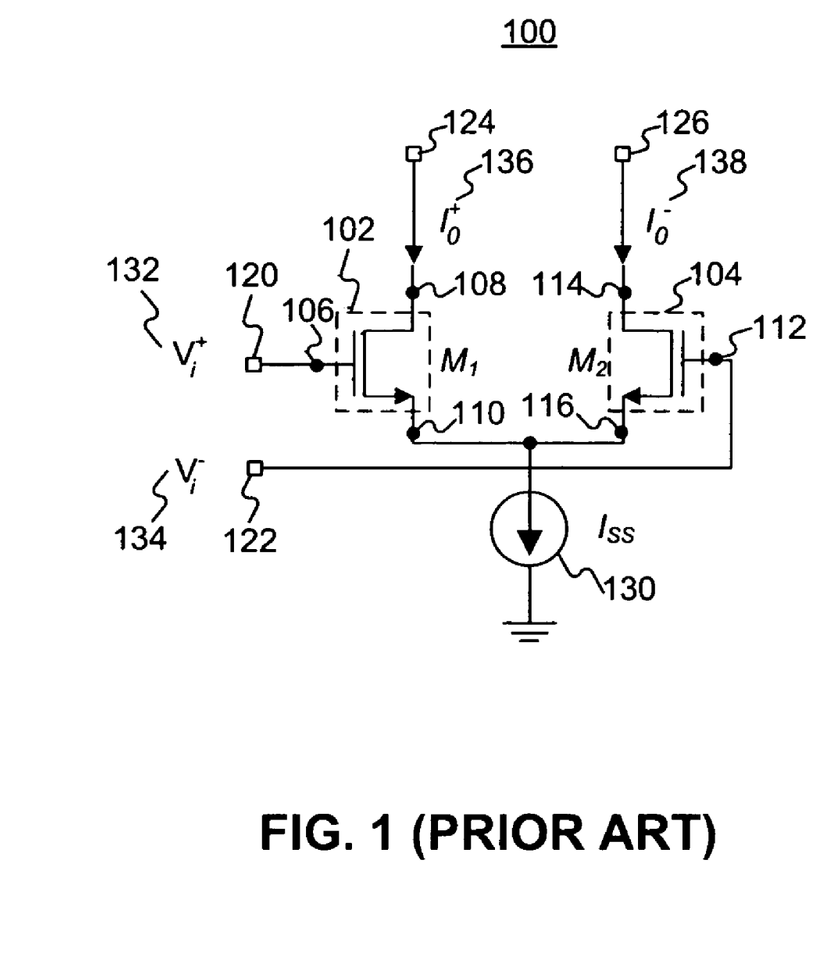
FIG. 1 illustrates a conventional differential pair circuit.

FIG. 1 illustrates a conventional differential pair circuit 100 that may operate as a transconductor in mixers, LNAs, or filters in a communication system. The differential pair circuit 100 includes a pair of differentially connected metal-oxide-semiconductor (MOS) transistors M1 102 and M2 104. The MOS transistor 102 includes a gate terminal 106, a drain terminal 108, and a source terminal 110. The MOS transistor 104 includes a gate terminal 112, a drain terminal 114, and a source terminal 116. The gate terminal 106 of the MOS transistor M1 102 is coupled to a first input terminal 120 of the differential pair circuit 100. The gate terminal 112 of the MOS transistor M2 104 is coupled to a second input terminal 122 of the differential pair circuit 100. The drain terminal 108 of the MOS transistor M1 102 is coupled to a first output terminal 124 of the differential pair circuit 100. The drain terminal 114 of the MOS transistor M2 104 is coupled to a second output terminal 126 of the differential pair circuit 100. The source terminal 110 of the MOS transistor M1 102 and the source terminal 116 of the MOS transistor M2 104 are connected together to be driven from a constant current source 130. By applying differential voltage signals at the input terminals 120 and 122, differential current signals are output at the output terminals 124 and 126.

In the conventional circuit 100, the MOS transistors M1 102 and M2 104 may have the same length and width, the same threshold voltage, and the same transconductance parameters. Input voltage signals $V_i^+$ 132 and $V_i^-$ 134 are applied to the input terminals 120 and 122, respectively. Output current signals $I_O^+$ 136 and $I_O^-$ 138 are provided on the output terminals 124 and 126, respectively. Denoting a differential input voltage as $v_{in}$ which is equal to $V_i^+ - V_i^-$, a constant current source as $I_{SS}$ 130, and transconductance parameters of the MOS transistors M1 102 and M2 104 as $\beta$, a differential output current $\Delta I_D$, which is equal to $I_O^+ - I_O^-$, can be expressed as:

$$\Delta I_D = \beta \cdot v_{in} \cdot \sqrt{\frac{2I_{ss}}{\beta} - (v_{in})^2}, \quad \text{Equation (1)}$$

when each of the MOS transistors M1 102 and M2 104 operates in a saturation region. As can be seen from Equation (1), within a range in which the differential input voltage $v_{in}$ has a small amplitude, there is approximately provided a linear transfer characteristic such that the output current $\Delta I_D$ varies linearly in relation to the differential input voltage $v_{in}$. However, when the differential input voltage $v_{in}$ increases to a level in the vicinity of the saturation region, the linearity is lost. As a result, the conventional differential pair circuit 100 may have a relatively narrow input voltage range within which to provide a linear transfer characteristic.

Figure 2:
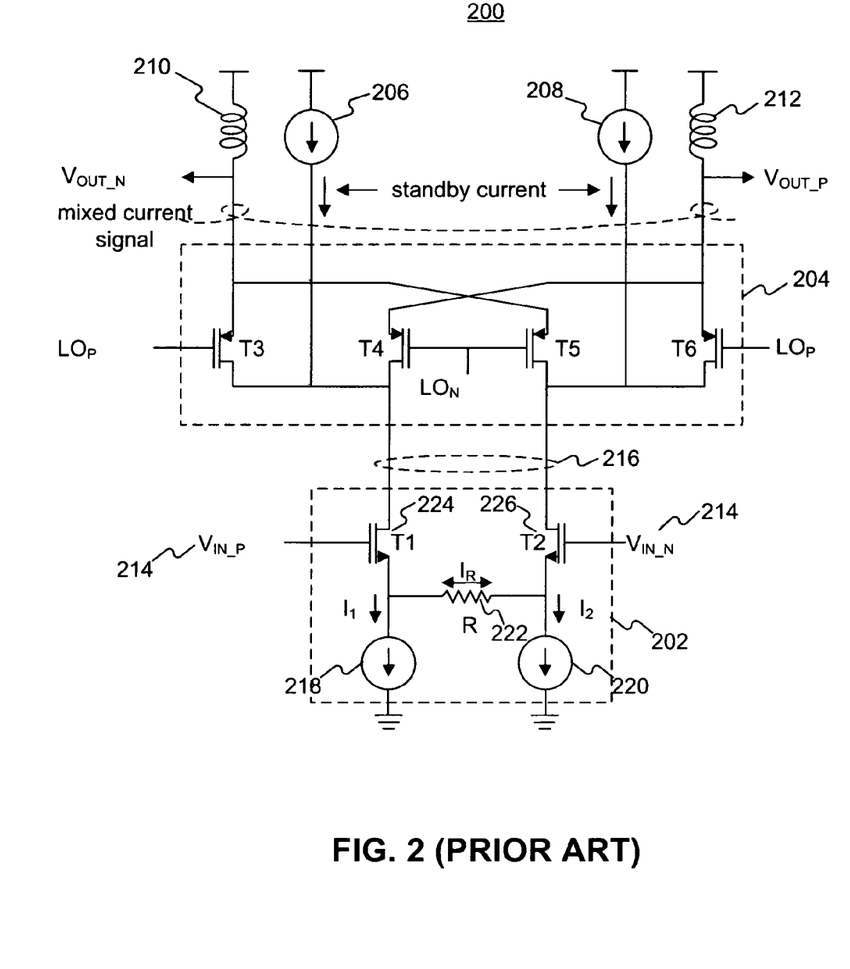
FIG. 2 illustrates a schematic block diagram of a differential signal mixer according to the prior art.

FIG. 2 illustrates a schematic block diagram of a differential signal mixer 200 in accordance with U.S. Pat. No. 7,107,025. The mixer 200 includes an input section 202, a mixing section 204, standby current sources 206 and 208, and tuning components 210 and 212. The input section 202 is operably coupled to receive an input voltage signal 214 and produce therefrom an output current signal 216 in accordance with transconductance properties of the input section 202. The input section 202 includes two current sources 218 and 220, a resistor 222, and two input transistors 224 and 226. Gate terminals of the input transistors 224 and 226 are operably coupled to receive a positive leg of the input voltage 214 and a negative leg of the input voltage 214, respectively. The resistor 222 is operably coupled between source terminals of the input transistors 224 and 226.

Figure 3:
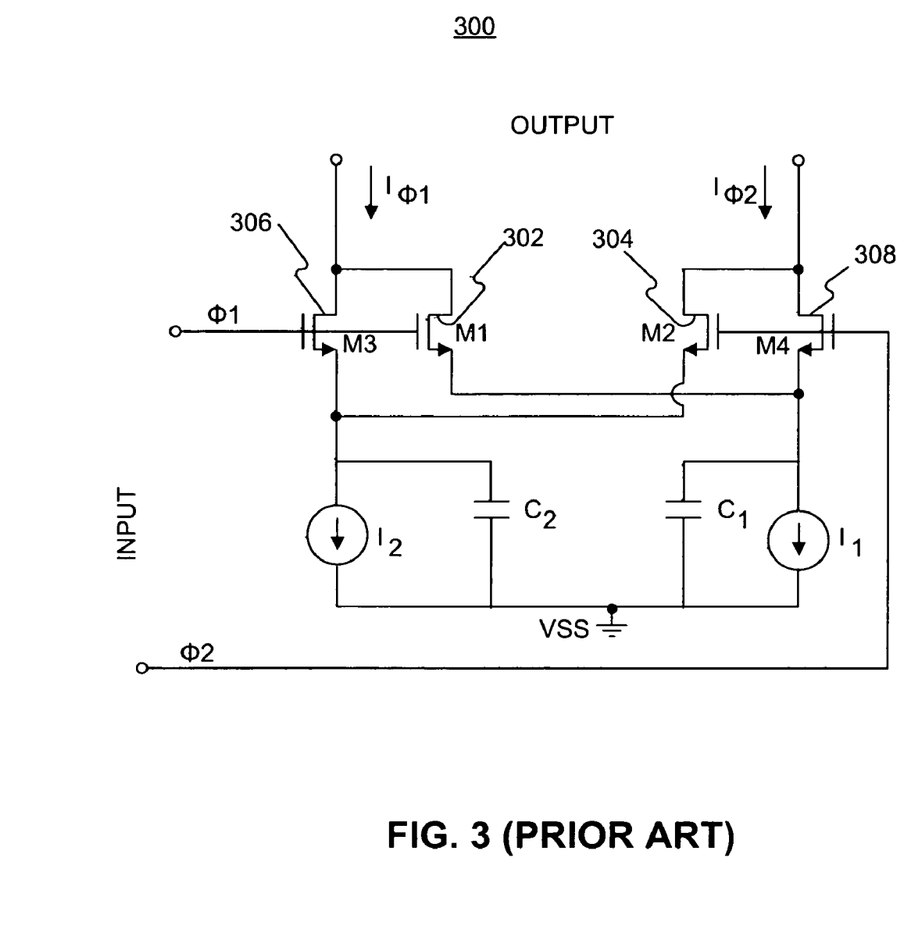
FIG. 3 illustrates a linearized transconductance circuit for application in a mixing circuit according to the prior art.

FIG. 3 illustrates a linearized transconductance circuit 300 for application in a mixing circuit using a double-balanced cell, in accordance with U.S. Pat. No. 6,542,019. The transconductance circuit 300 includes a first MOS transistor M1 302 and a second MOS transistor M2 304 to create a first balanced pair. Due to a small width-to-length ratio, the first balanced pair exhibits a relatively large linear input range. In addition, the transconductance circuit 300 includes a third MOS transistor M3 306 and a fourth MOS transistor M4 308 to create a second balanced pair. The second balanced pair of the MOS transistors M3 306 and M4 308 have a larger width-to-length ratio than the first balanced pair of the MOS transistors M1 302 and M2 304. This configuration is intended to achieve improved linearity and an improved noise figure.

In addition to linearity, such parameters as gain, noise, or power efficiency, may be important, according to the specific application. However, designing to improve linearity may have a detrimental effect on the other parameters.

SUMMARY OF THE INVENTION

In accordance with the invention, there is provided a transconductor to convert an input voltage to an output current, the transconductor comprising: a primary transconductance stage to provide the output current from the input voltage and a driving current; an adaptive transconductance stage coupled in series with the primary transconductance stage to generate the driving current from the input voltage; and a bias circuit coupled to provide a primary bias voltage to the primary transconductance stage and an adaptive bias voltage to the adaptive transconductance stage.

Also in accordance with the invention, there is provided a transconductor to convert an input voltage to an output current, the transconductor comprising: a primary transconductance stage to provide the output current from the input voltage and a driving current; an adaptive transconductance stage coupled in series with the primary transconductance stage to generate the driving current from the input voltage; a bias circuit coupled to provide a primary bias voltage to the primary transconductance stage and an adaptive bias voltage to the adaptive transconductance stage; and a current source coupled to the primary transconductance stage and the adaptive transconductance stage.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and, together with the description, serve to explain the principles of the invention.

DESCRIPTION OF THE EMBODIMENTS

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments consistent with the present invention do not represent all implementations consistent with the invention. Instead, they are merely examples of systems and methods consistent with aspects related to the invention as recited in the appended claims.

In embodiments consistent with the present invention, a transconductor with improved linearity includes a primary transconductance stage having a first differential pair circuit and an adaptive transconductance stage having a second differential pair circuit. Operation of the linear transconductor may have two phases, corresponding to operation region I and operation region II, respectively. In operation region I, the adaptive transconductance stage provides a $2^{nd}$-order harmonic current to substantially cancel a $3^{rd}$-order harmonic distortion in the primary transconductance stage. As a result, nonlinearity of the primary transconductance stage is compensated and the linear transconductor has a wide input voltage range. In operation region II, full switching occurs in the primary transconductance stage. The primary transconductance stage operates as a cascode transistor and the adaptive transconductance stage provides output currents.

Also in embodiments consistent with the present invention, a differential input voltage applied across a first leg and a second leg of the linear transconductor is applied to the primary transconductance stage and the adaptive transconductance stage. A differential output current having a first leg and a second leg is provided on the primary transconductance stage. The differential output current varies linearly in relation to the differential input voltage within a wide dynamic range.

Figure 4:
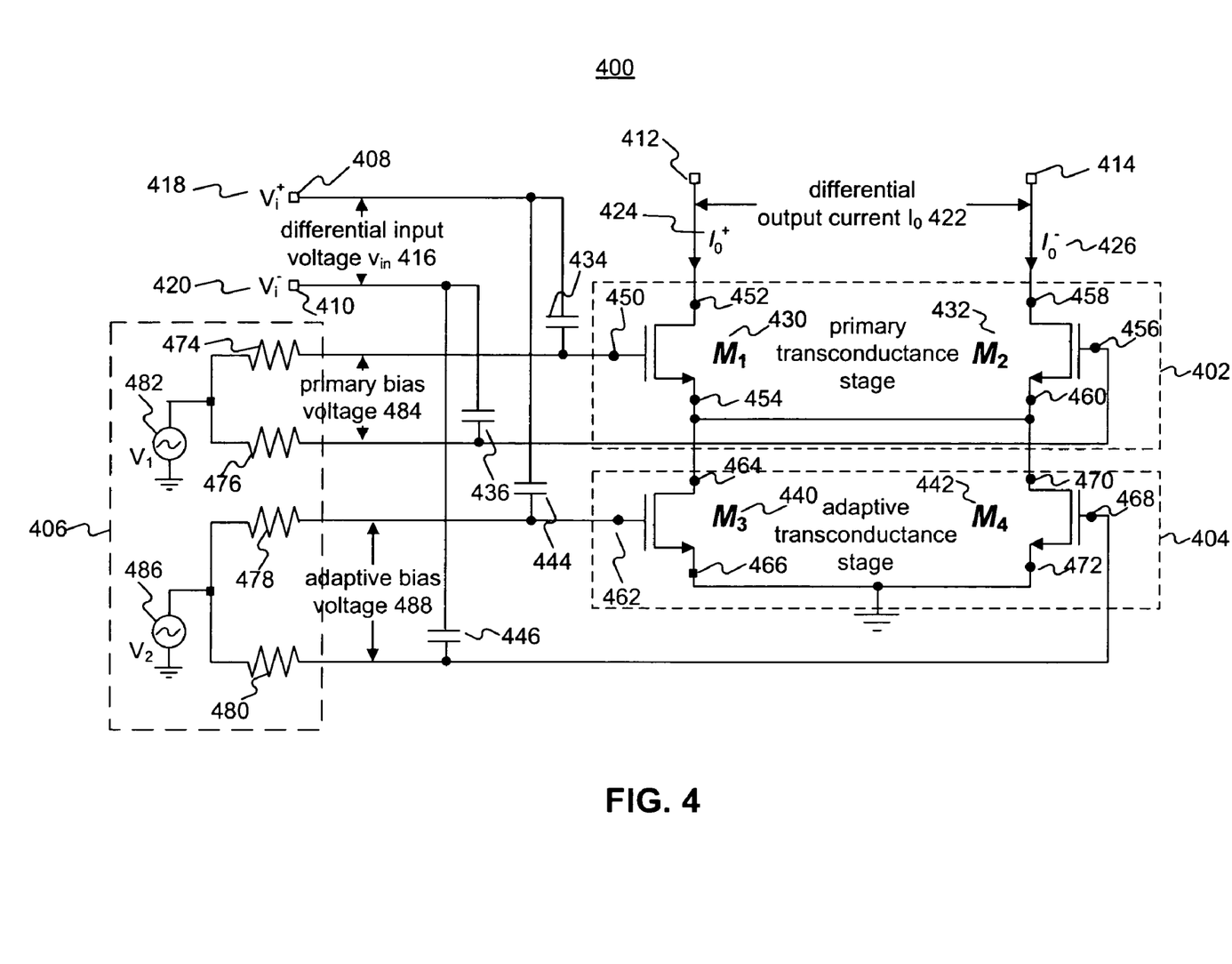
FIG. 4 illustrates a schematic block diagram of a linear transconductor according to an exemplary embodiment.

FIG. 4 illustrates a schematic block diagram of a linear transconductor 400 according to an exemplary embodiment. The transconductor 400 includes a primary transconductance stage 402, an adaptive transconductance stage 404, and a bias circuit 406. In addition, the transconductor 400 includes first and second input terminals 408 and 410, and first and second output terminals 412 and 414. A differential input voltage $v_{in}$ 416 with a first leg $V_i^+$ 418 and a second leg $V_i^-$ 420 is applied to the primary transconducance stage 402 and the adaptive transconductance stage 404. A differential output current $I_O$ 422 having a first leg $I_O^+$ 424 and a second leg $I_O^-$ 426 is provided on the primary transconducance stage 402. The differential output current $I_O$ 422 varies linearly in relation to the differential input voltage $v_{in}$ 416 within a wide dynamic range.

The primary transconductance stage 402 includes a first MOS transistor M1 430 and a second MOS transistor M2 432. The MOS transistors M1 430 and M2 432 have substantially the same width-to-length ratio and substantially the same transconductance parameter. The first MOS transistor M1 430 is operably coupled to receive the first leg $V_i^+$ 418 of the differential input voltage $v_{in}$ 416 via a first capacitor 434. The second MOS transistor M2 432 is operably coupled to receive the second leg $V_i^-$ 420 of the differential input voltage $v_{in}$ 416 via a second capacitor 436. The adaptive transconductance stage 404 includes a third MOS transistor M3 440 and a fourth MOS transistor M4 442. The MOS transistors M3 440 and M4 442 have substantially the same width-to-length ratio and substantially the same transconductance parameter. The third MOS transistor M3 440 is operably coupled to receive the first leg $V_i^+$ 418 of the differential input voltage $v_{in}$ 416 via a third capacitor 444. The fourth MOS transistor M4 442 is operably coupled to receive the second leg $V_i^-$ 420 of the differential input voltage $v_{in}$ 416 via a fourth capacitor 446.

The first MOS transistor M1 430 includes a first gate terminal 450, a first drain terminal 452, and a first source terminal 454. The first gate terminal 450 is coupled to the first input terminal 408 via the first capacitor 434. The second MOS transistor M2 432 includes a second gate terminal 456, a second drain terminal 458, and a second source terminal 460. The second gate terminal 456 is coupled to the second input terminal 410 via the second capacitor 436.

The third MOS transistor M3 440 includes a third gate terminal 462, a third drain terminal 464, and a third source terminal 466. The third gate terminal 462 is coupled to the first input terminal 408 via the third capacitor 444. The fourth MOS transistor M4 442 includes a fourth gate terminal 468, a fourth drain terminal 470, and a fourth source terminal 472. The fourth gate terminal 468 is coupled to the second input terminal 410 via the fourth capacitor 446.

The primary transconductance stage 402 is coupled in series with the adaptive transconductance stage 404 to be driven by a current from the adaptive transconductance stage 404. The differential output current $I_O$ 422 is provided by the primary transconductance stage 402. More particularly, the first source terminal 454 and the second source terminal 460 of the primary transconductance stage 402 are coupled together to the third drain terminal 464 and the fourth drain terminal 470 of the adaptive transconductance stage 404, respectively. The first leg $I_O^+$ 424 of the differential output current $I_O$ 422 is provided on the first output terminal 412 and the second leg $I_O^-$ 426 of the differential output current $I_O$ 422 is provided on the second output terminal 414.

The bias circuit 406 includes two pairs of resistors 474 and 476, and 478 and 480. The pair of resistors 474 and 476 are coupled together to a first reference voltage $V_1$ 482 and provide a primary bias voltage 484 to the primary transconductance stage 402. The pair of resistors 478 and 480 are coupled together to a second reference voltage $V_2$ 486 and provide an adaptive bias voltage 488 to the adaptive transconductance stage 404.

In embodiments consistent with the present invention, operation of the transconductor 400 may have two phases, corresponding to operation region I and operation region II, respectively. In operation region I, the differential output current $I_O$ 422 is provided by the primary transconductance stage 402. The adaptive transconductance stage 404 provides a $2^{nd}$-order harmonic current to substantially cancel a $3^{rd}$-order harmonic distortion in the primary transconductance stage 402. As a result, nonlinearity of the primary transconductance stage 402 is compensated and the transconductor 400 has a wide input voltage range, which is illustrated in detail as follows.

As shown above in Equation (1), the differential output current $I_O$ 422 provided by the primary transconductance stage 402 from the differential input voltage $v_{in}$ 416 can be expressed as:

$$I_o = \beta_{1,2} \cdot v_{in} \cdot \sqrt{\frac{2I_{ss}}{\beta_{1,2}} - (v_{in})^2},\qquad \text{Equation (2)}$$

when each of the MOS transistors M1 430 and M2 432 operates in a saturation region. The MOS transistors M1 430 and M2 432 have substantially the same width-to-length ratio and substantially the same transconductance parameter $\beta_{1,2}$. The driving current $I_{SS}$ for the primary transconductance stage 402 is provided by the adaptive transconductance stage 404 and can be expressed as:

$$I_{ss} = I_{D3} + I_{D4} = \beta_{3,4} \cdot \left\{ \left(V_{GS3} + \frac{v_{in}}{2} - V_{TH}\right)^2 + \left(V_{GS4} - \frac{v_{in}}{2} - V_{TH}\right)^2 \right\} \qquad \text{Equation (3)}$$

$$= \beta_{3,4} \cdot \left\{ 2 \cdot (V_{GS3,4} - V_{TH})^2 + 2 \cdot \left(\frac{v_{in}}{2}\right)^2 \right\},$$

where $I_{D3}$ and $I_{D4}$ are drain currents of the third MOS transistor M3 440 and the fourth MOS transistor M4 442, respectively; $V_{GS3}$ and $V_{GS4}$ are gate-source voltages of the third MOS transistor M3 440 and the fourth MOS transistor M4 442, respectively, and equal to $V_{GS3,4}$; $V_{TH}$ is a constant threshold voltage; and $v_{in}$ is the differential input voltage 416.

If the transconductance parameter $\beta_{1,2}$ for the MOS transistors M1 430 and M2 432 is equal to the transconductance parameter $\beta_{3,4}$ for the MOS transistors M3 440 and M4 442, or the MOS transistors M1 430, M2 432, M3 440, and M4 442 have substantially the same width-to-length ratio, substituting Equation (3) into Equation (2) yields $$I_o = \beta_{1,2} \cdot v_{in} \cdot \sqrt{\frac{2 \cdot \beta_{3,4} \cdot \left\{ 2 \cdot (V_{GS3,4} - V_{TH})^2 + 2 \cdot \left(\frac{v_{in}}{2}\right)^2 \right\}}{\beta_{1,2}} - (v_{in})^2} \qquad \text{Equation (4)}$$

$$= 2 \cdot \beta_{1,2} \cdot (V_{GS3,4} - V_{TH}) \cdot v_{in}.$$

As shown in Equation (4), the adaptive transconductance stage 404 provides the $2^{nd}$-order harmonic current to substantially cancel the $3^{rd}$-order harmonic distortion in the primary transconductance stage 402. Therefore nonlinearity of the primary transconductance stage 402 is compensated. As a result, the differential output current $I_O$ 422 varies linearly in relation to the differential input voltage $v_{in}$ 416 in a wide input voltage range in operation region I, i.e., $$v_{in} \leq \sqrt{\frac{I_{ss}}{\beta_{1,2}}}.$$

In operation region II, i.e., $$v_{in} > \sqrt{\frac{I_{ss}}{\beta_{1,2}}},$$

one of the MOS transistors M1 430 and M2 432 carries the entire current $I_{SS}$, turning off the other one of the MOS transistors. Therefore full switching occurs in the primary transconductance stage 402. The primary transconductance stage 402 operates as a cascode transistor and the adaptive transconductance stage 404 provides output currents.

Figure 5:
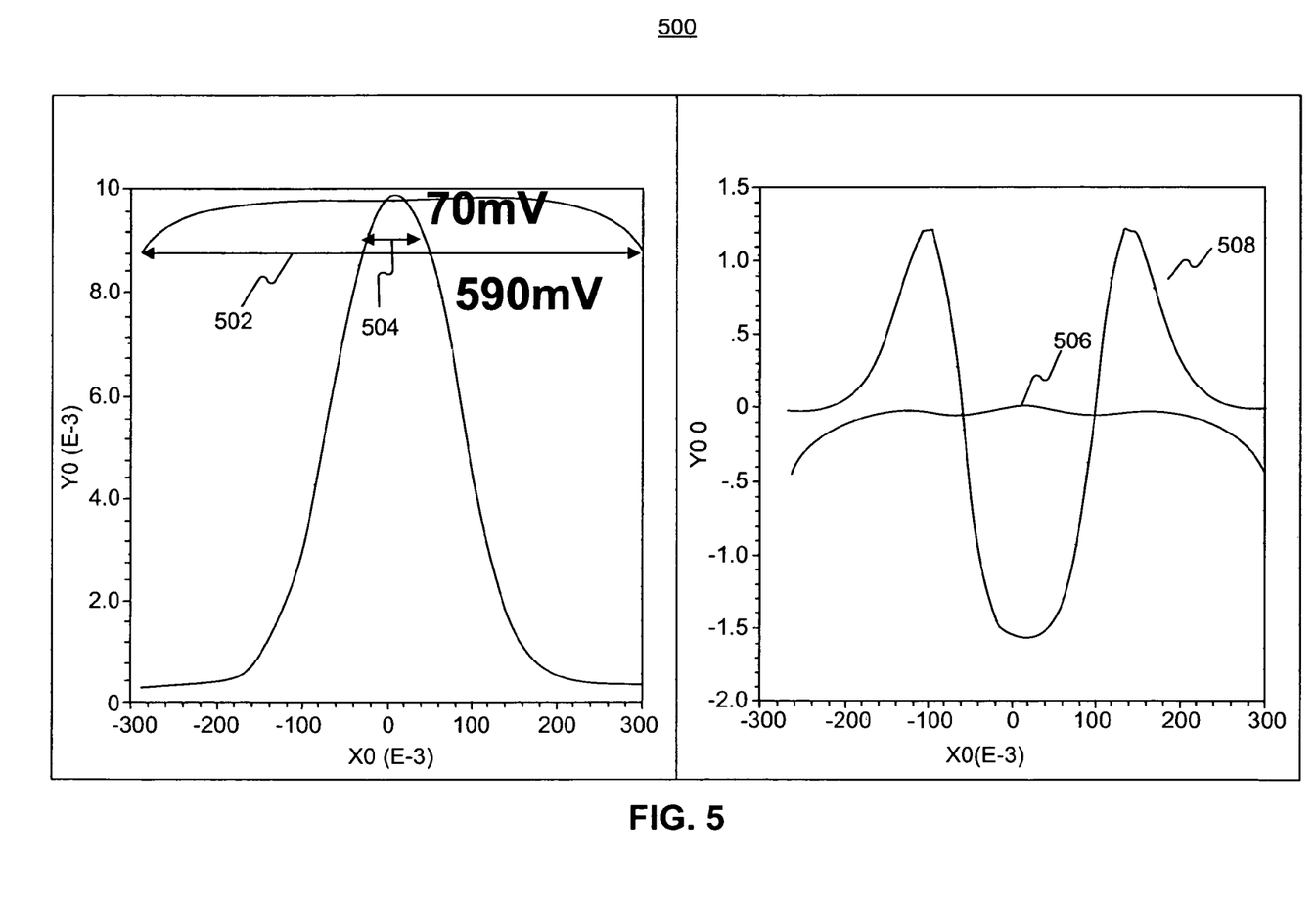
FIG. 5 shows simulation results illustrating that an input voltage range for the linear transconductor shown in FIG. 4.

FIG. 5 shows simulation results 500 illustrating that an input voltage range 502 for the transconductor 400 (FIG. 4) may be improved compared to an input voltage range 504 for the conventional differential pair circuit 100 (FIG. 1). Referring to FIG. 5, the input voltage range 502 (590 mV) for the transconductor 400 is over eight times wider than the input voltage range 504 (70 mV) for the conventional differential pair circuit 100. The $3^{rd}$-order harmonic distortion 506 in the transconductor 400 is greatly suppressed compared to the $3^{rd}$-order harmonic distortion 508 for the conventional differential pair circuit 100.

Figure 6:
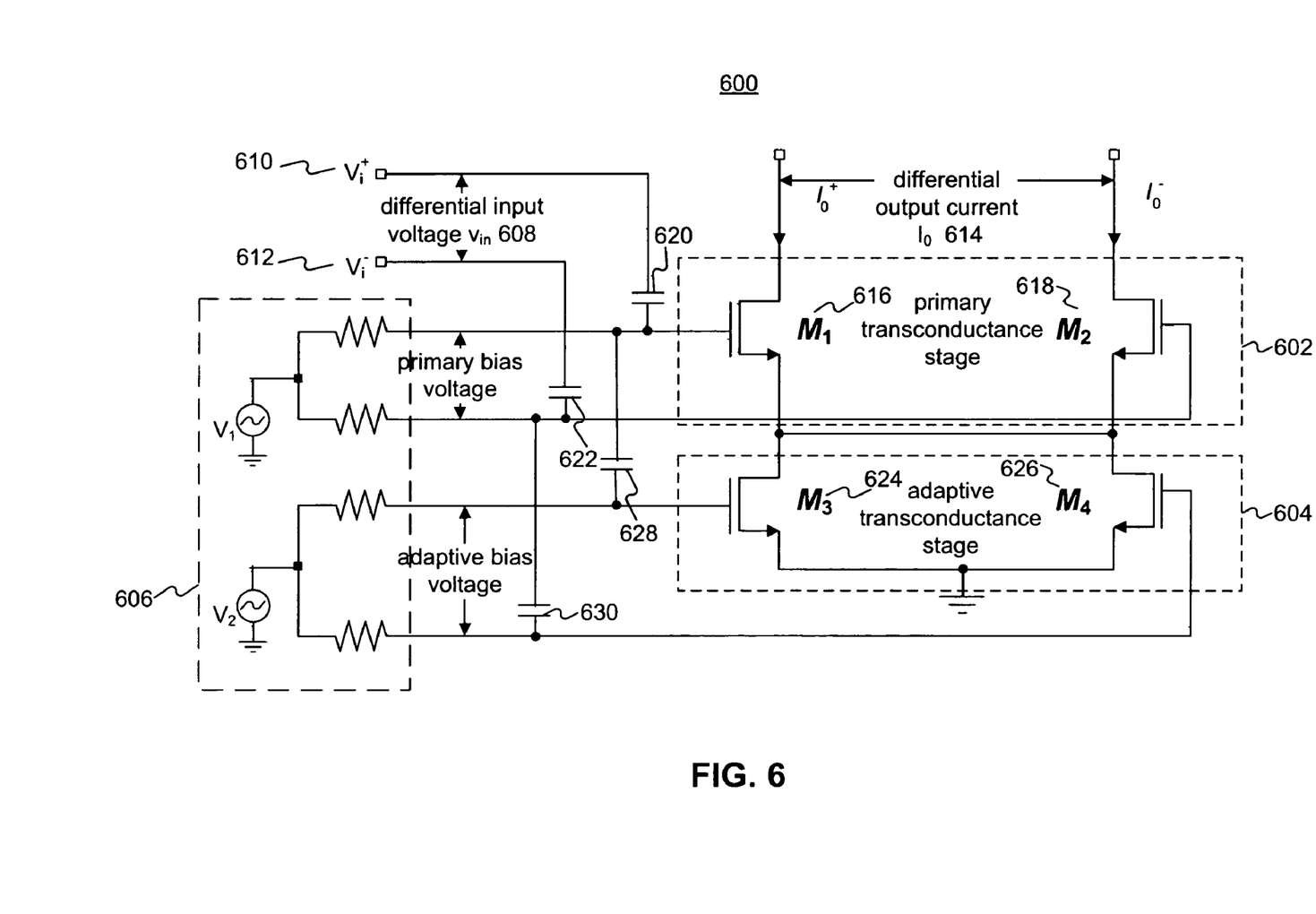
FIG. 6 illustrates a schematic block diagram of a linear transconductor according to an exemplary embodiment.

In embodiments consistent with the present invention, different circuit configurations may be used to apply differential input voltages to the primary transconductance stage and the adaptive transconductance stage of the linear transconductor. FIG. 6 illustrates a schematic block diagram of a linear transconductor 600 according to an alternate exemplary embodiment. The transconductor 600 includes a primary transconductance stage 602, an adaptive transconductance stage 604, and a bias circuit 606. A differential input voltage $v_{in}$ 608 with a first leg $V_i^+$ 610 and a second leg $V_i^-$ 612 is applied to the primary transconductance stage 602 and the adaptive transconductance stage 604. A differential output current $I_O$ 614 is provided by the primary transconductance stage 602. The differential output current $I_O$ 614 varies linearly in relation to the differential input voltage $v_{in}$ 608 within a wide dynamic range.

In transconductor 600, the primary transconductance stage 602, the adaptive transconductance stage 604, and the bias circuit 606 operate as previously discussed with reference to the primary transconductance stage 402, the adaptive transconductance stage 404, and the bias circuit 406 in FIG. 4, respectively. The primary transconductance stage 602 includes a first MOS transistor M1 616 and a second MOS transistor M2 618. The first MOS transistor M1 616 is operably coupled to receive the first leg $V_i^+$ 610 of the differential input voltage $v_{in}$ 608 via a first capacitor 620. The second MOS transistor M2 618 is operably coupled to receive the second leg $V_i^-$ 612 of the differential input voltage $v_{in}$ 608 via a second capacitor 622. The adaptive transconductance stage 604 includes a third MOS transistor M3 624 and a fourth MOS transistor M4 626. The third MOS transistor M3 624 is operably coupled to receive the first leg $V_i^+$ 610 of the differential input voltage $v_{in}$ 608 via a third capacitor 628 and the first capacitor 620. The fourth MOS transistor M4 626 is operably coupled to receive the second leg $V_i^-$ 612 of the differential input voltage $v_{in}$ 608 via a fourth capacitor 630 and the second capacitor 622.

Figure 7:
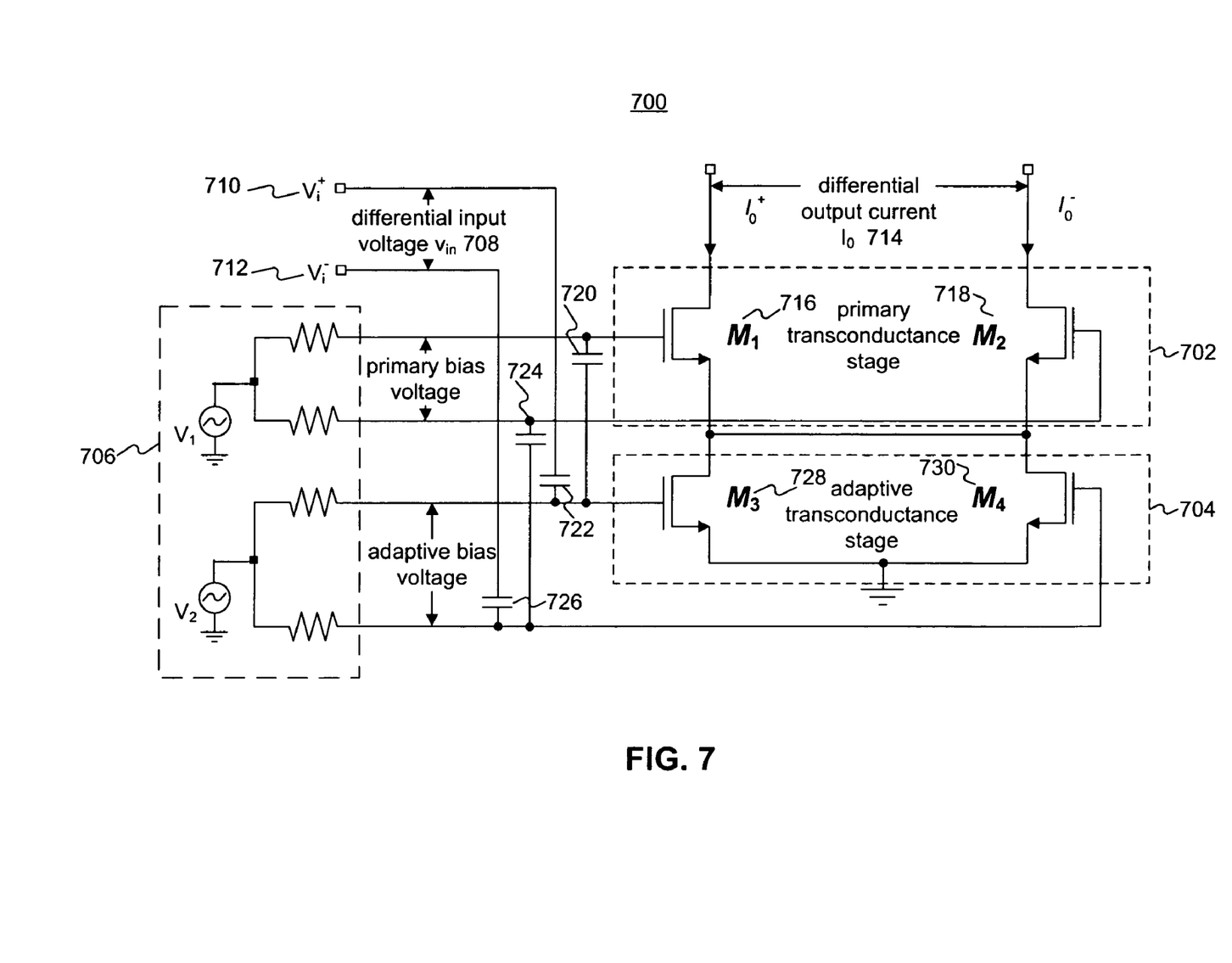
FIG. 7 illustrates a schematic block diagram of a linear transconductor according to an exemplary embodiment.

FIG. 7 illustrates a schematic block diagram of a linear transconductor 700 according to another exemplary embodiment. The transconductor 700 includes a primary transconductance stage 702, an adaptive transconductance stage 704, and a bias circuit 706. A differential input voltage $v_{in}$ 708 with a first leg $V_i^+$ 710 and a second leg $V_i^-$ 712 is applied to the primary transconductance stage 702 and the adaptive transconductance stage 704. A differential output current $I_O$ 714 is provided by the primary transconductance stage 702. The differential output current $I_O$ 714 varies linearly in relation to the differential input voltage $v_{in}$ 708 within a wide dynamic range.

In transconductor 700, the primary transconductance stage 702, the adaptive transconductance stage 704, and the bias circuit 706 operate as previously discussed with reference to the primary transconductance stage 402, the adaptive transconductance stage 404, and the bias circuit 406 in FIG. 4, respectively. The primary transconductance stage 702 includes a first MOS transistor M1 716 and a second MOS transistor M2 718. The first MOS transistor M1 716 is operably coupled to receive the first leg $V_i^+$ 710 of the differential input voltage $v_{in}$ 708 via a first capacitor 720 and a second capacitor 722. The second MOS transistor M2 718 is operably coupled to receive the second leg $V_i^-$ 712 of the differential input voltage $v_{in}$ 708 via a third capacitor 724 and a fourth capacitor 726. The adaptive transconductance stage 704 includes a third MOS transistor M3 728 and a fourth MOS transistor M4 730. The third MOS transistor M3 728 is operably coupled to receive the first leg $V_i^+$ 710 of the differential input voltage $v_{in}$ 708 via the second capacitor 722. The fourth MOS transistor M4 730 is operably coupled to receive the second phase $V_i^-$ 712 of the differential input voltage $v_{in}$ 708 via the fourth capacitor 726.

Figure 8:
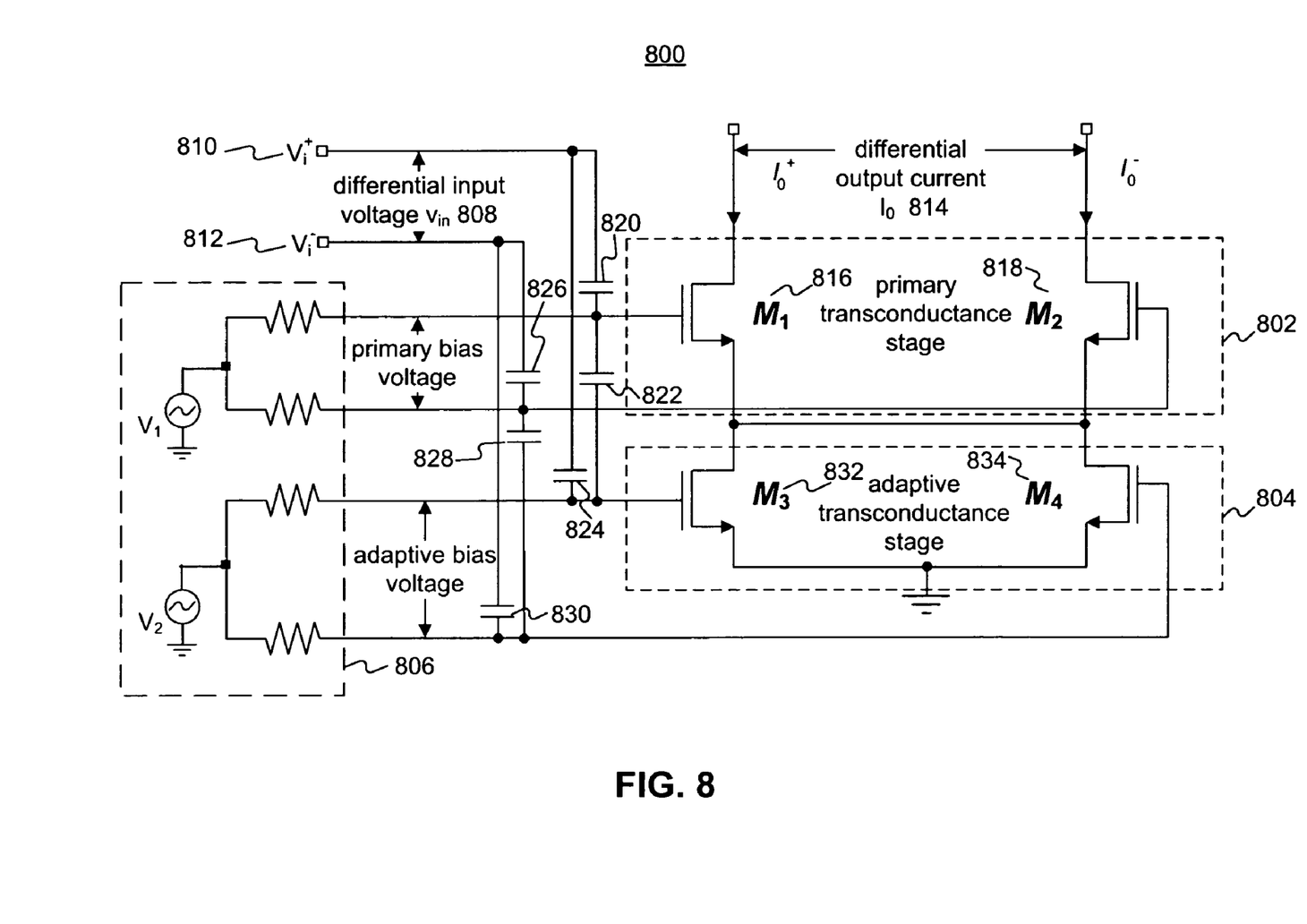
FIG. 8 illustrates a schematic block diagram of a linear transconductor according to an exemplary embodiment.

FIG. 8 illustrates a schematic block diagram of a linear transconductor 800 according to yet another exemplary embodiment. The transconductor 800 includes a primary transconductance stage 802, an adaptive transconductance stage 804, and a bias circuit 806. A differential input voltage $v_{in}$ 808 with a first leg $V_i^+$ 810 and a second leg $V_i^-$ 812 is applied to the primary transconductance stage 802 and the adaptive transconductance stage 804. A differential output current $I_O$ 814 is provided by the primary transconductance stage 802. The output current $I_O$ 814 varies linearly in relation to the differential input voltage $v_{in}$ 808 within a wide dynamic range.

In transconductor 800, the primary transconductance stage 802, the adaptive transconductance stage 804, and the bias circuit 806 operate as previously discussed with reference to the primary transconductance stage 402, the adaptive transconductance stage 404, and the bias circuit 406 in FIG. 4, respectively. The primary transconductance stage 802 includes a first MOS transistor M1 816 and a second MOS transistor M2 818. The first MOS transistor M1 816 is operably coupled to receive the first leg $V_i^+$ 810 of the differential input voltage $v_{in}$ 808 via a first capacitor 820, a second capacitor 822, and a third capacitor 824, wherein the first capacitor 820 is coupled in parallel with the second and third capacitors 822 and 824 and the second and third capacitors 822 and 824 are in series. The second MOS transistor M2 818 is operably coupled to receive the second leg $V_i^-$ 812 of the differential input voltage $v_{in}$ 808 via a fourth capacitor 826, a fifth capacitor 828, and a sixth capacitor 830, wherein the fourth capacitor 826 is coupled in parallel with the fifth and sixth capacitors 828 and 830 and the fifth and sixth capacitors 828 and 830 are in series. The adaptive transconductance stage 804 includes a third MOS transistor M3 832 and a fourth MOS transistor M4 834. The third MOS transistor M3 832 is operably coupled to receive the first leg $V_i^+$ 810 of the differential input voltage $v_{in}$ 808 via the first capacitor 820, the second capacitor 822, and the third capacitor 824, wherein the third capacitor 824 is coupled in parallel with the first and second capacitors 820 and 822 and the first and second capacitors 820 and 822 are in series. The fourth MOS transistor M4 834 is operably coupled to receive the second leg $V_i^-$ 812 of the differential input voltage $v_{in}$ 808 via the fourth capacitor 826, the fifth capacitor 828, and the sixth capacitor 830, wherein the sixth capacitor 830 is coupled in parallel with the fourth and fifth capacitors 826 and 828 and the fourth and fifth capacitors 826 and 828 are in series.

Figure 9:
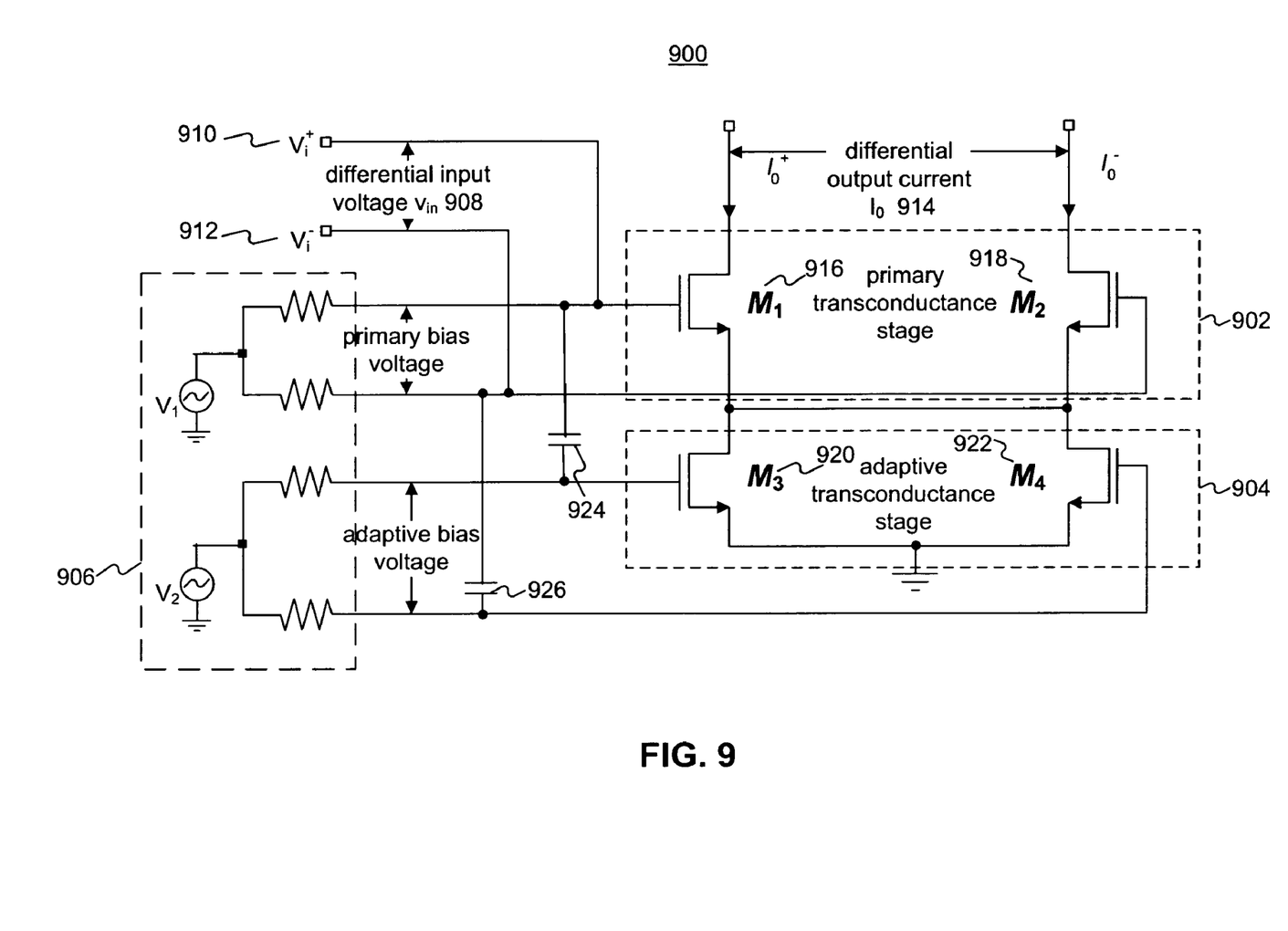
FIG. 9 illustrates a schematic block diagram of a linear transconductor according to an exemplary embodiment.

FIG. 9 illustrates a schematic block diagram of a linear transconductor 900 according to still another exemplary embodiment. The transconductor 900 includes a primary transconductance stage 902, an adaptive transconductance stage 904, and a bias circuit 906. A differential input voltage $v_{in}$ 908 with a first leg $V_i^+$ 910 and a second leg $V_i^-$ 912 is applied to the primary transconductance stage 902 and the adaptive transconductance stage 904. A differential output current $I_O$ 914 is provided by the primary transconductance stage 902. The output current $I_O$ 914 varies linearly in relation to the differential input voltage $v_{in}$ 908 within a wide dynamic range.

In transconductor 900, the primary transconductance stage 902, the adaptive transconductance stage 904, and the bias circuit 906 operate as previously discussed with reference to the primary transconductance stage 402, the adaptive transconductance stage 404, and the bias circuit 406 in FIG. 4, respectively. The primary transconductance stage 902 includes a first MOS transistor M1 916 and a second MOS transistor M2 918. The first MOS transistor M1 916 is operably coupled to receive the first leg $V_i^+$ 910 of the differential input voltage $v_{in}$ 908 directly. The second MOS transistor M2 918 is operably coupled to receive the second leg $V_i^-$ 912 of the differential input voltage $v_{in}$ 908 directly. The adaptive transconductance stage 904 includes a third MOS transistor M3 920 and a fourth MOS transistor M4 922. The third MOS transistor M3 920 is operably coupled to receive the first leg $V_i^+$ 910 of the differential input voltage $v_{in}$ 908 via a first capacitor 924. The fourth MOS transistor M4 922 is operably coupled to receive the second leg $V_i^-$ 912 of the differential input voltage $v_{in}$ 908 via a second capacitor 926.

Figure 10A:
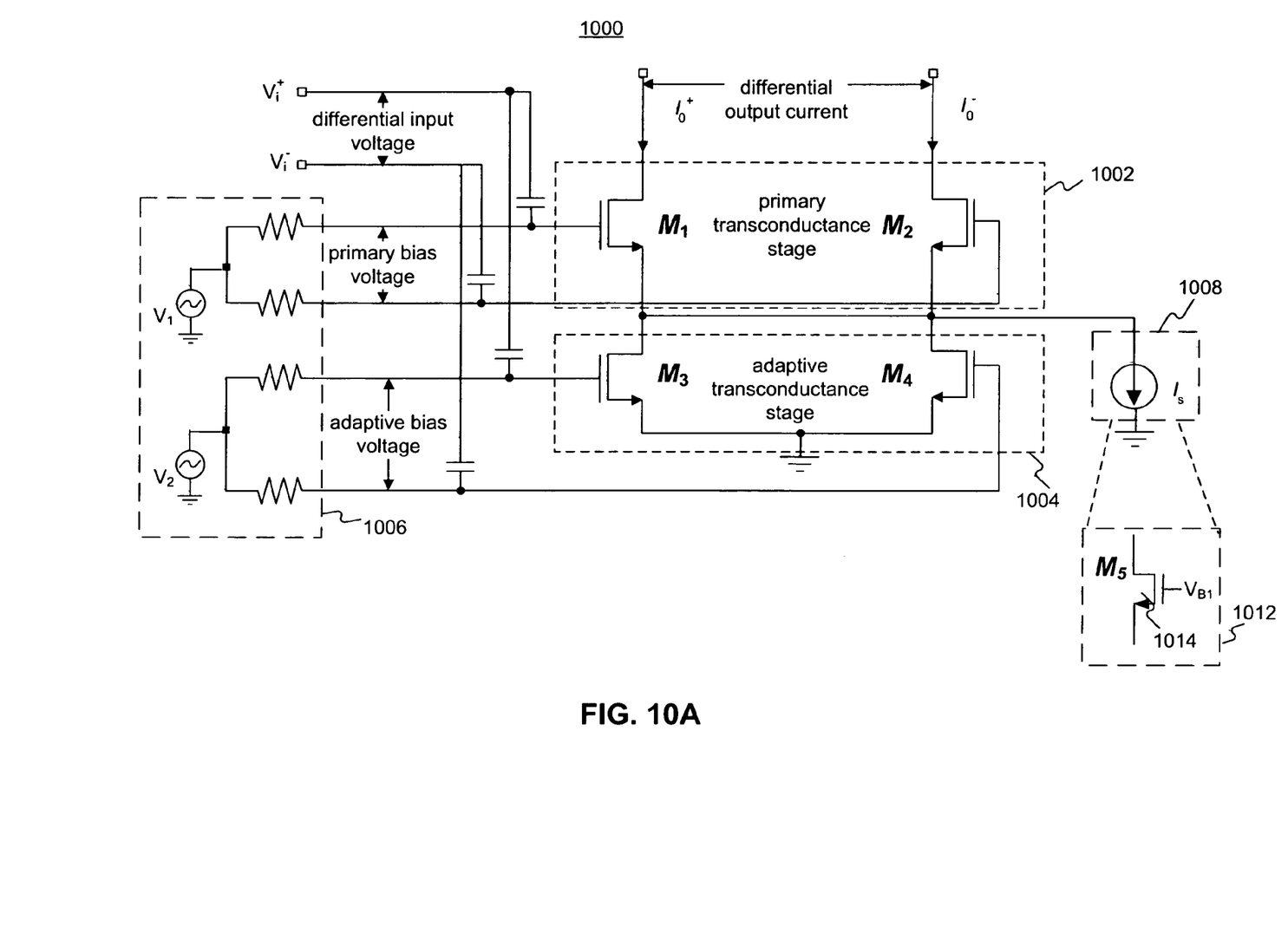
FIGS. 10A and 10B illustrate schematic block diagrams of a linear transconductor according to an exemplary embodiment.
Figure 10B:
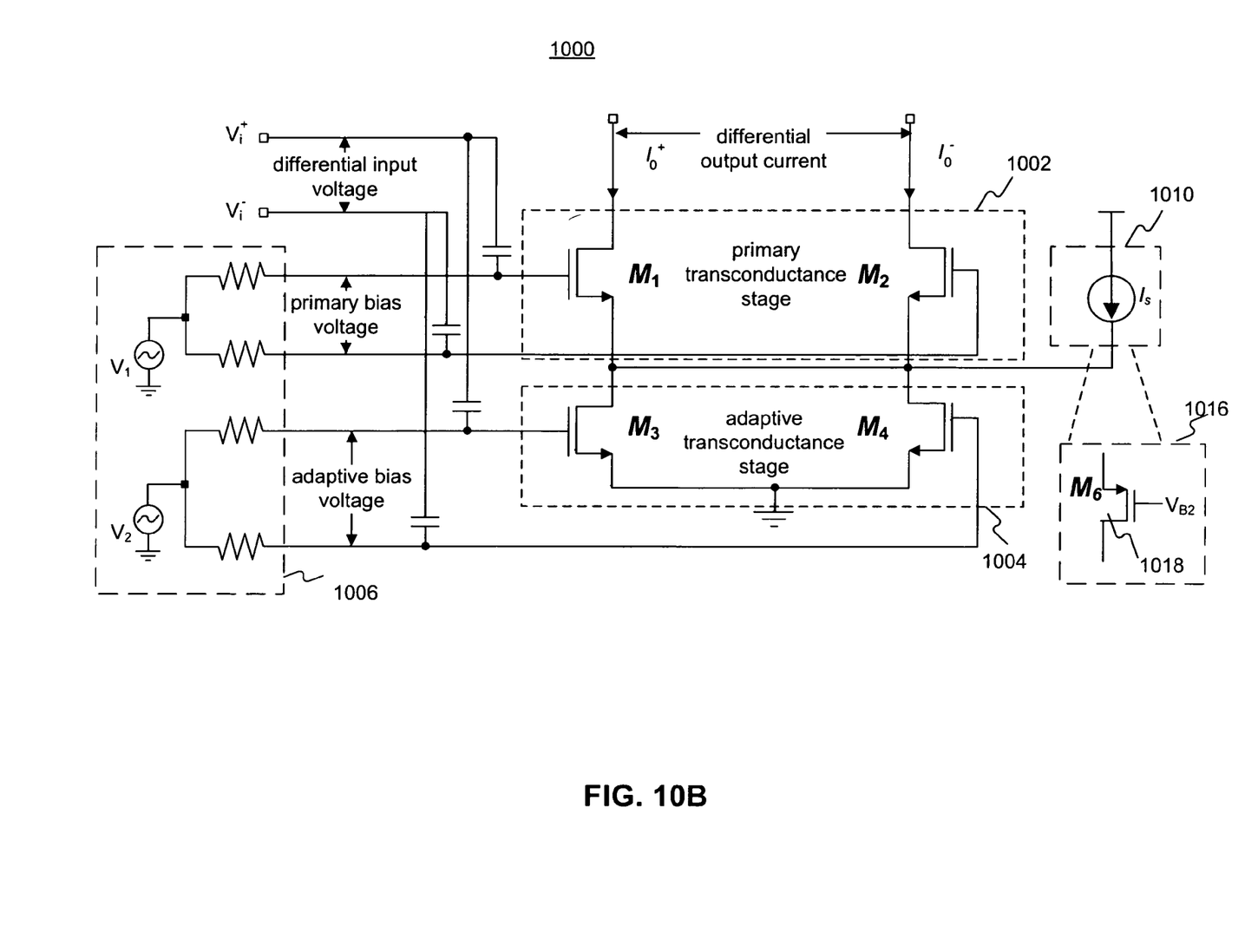

FIGS. 10A and 10B illustrate schematic block diagrams of a linear transconductor 1000 according to an exemplary embodiment. The transconductor 1000 includes a primary transconductance stage 1002, an adaptive transconductance stage 1004, a bias circuit 1006, and a current source 1008 (FIG. 10A) or 1010 (FIG. 10B). The primary transconductance stage 1002, the adaptive transconductance stage 1004, and the bias circuit 1006 operate as previously discussed with reference to the primary transconductance stage 402, the adaptive transconductance stage 404, and the bias circuit 406 in FIG. 4, respectively. One terminal of the current source 1008 or 1010 is coupled to the primary transconductance stage 1002 and the adaptive transconductance stage 1004, and further improves an input voltage range for the linear transconductor 1000. In one embodiment, as shown in block 1012 in FIG. 10A, the current source 1008 comprises an NMOS transistor 1014 operating in a saturation region. A voltage $V_{B1}$ is applied to the gate terminal of the NMOS transistor 1014. In another embodiment, as shown in block 1016 in FIG. 10B, the current source 1010 comprises a PMOS transistor 1018 operating in a saturation region. A voltage $V_{B2}$ is applied to the gate terminal of the PMOS transistor 1018.

It should be noted that the MOS transistors M1-M4 in each of the linear transconductors 400, 600, 700, 800, 900, and 1000 may comprise either all NMOS or all PMOS transistors. In the exemplary embodiments of FIGS. 4 and 6-10, the MOS transistors M1-M4 in each of the linear transconductors 400, 600, 700, 800, 900, and 1000 comprise NMOS transistors. Alternatively, the MOS transistors M1-M4 in each of the linear transconductors 400, 600, 700, 800, 900, and 1000 may comprise PMOS transistors.

Other embodiments of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

It will be appreciated that the present invention is not limited to the exact construction that has been described above and illustrated in the accompanying drawings, and that various modifications and changes can be made without departing from the scope thereof. It is intended that the scope of the invention only be limited by the appended claims.

What is claimed is:

1. A transconductor to convert an input voltage to an output current, the transconductor comprising:
   a primary transconductance stage to provide the output current from the input voltage and a driving current;
   an adaptive transconductance stage coupled in series with the primary transconductance stage to generate the driving current from the input voltage; and
   a bias circuit coupled to provide a primary bias voltage to the primary transconductance stage and an adaptive bias voltage to the adaptive transconductance stage;
   wherein the primary transconductance stage includes
      a first transistor having a first gate terminal, a first source terminal, and a first drain terminal, and
      a second transistor having a second gate terminal, a second source terminal, and a second drain terminal;
   wherein the adaptive transconductance stage includes
      a third transistor having a third gate terminal, a third source terminal, and a third drain terminal, and
      a fourth transistor having a fourth gate terminal, a fourth source terminal, and a fourth drain terminal; and
   wherein the first source terminal and the second source terminal are coupled together to the third drain terminal and the fourth drain terminal.

2. The transconductor of claim 1, further comprising first and second input terminals for receiving the input voltage, the first and second input terminals coupled to the primary transconductance stage and the adaptive transconductance stage,
   wherein the a first transistor is coupled to the first input terminal to receive a first leg of the input voltage; and
   the second transistor is coupled to the second input terminal to receive a second leg of the input voltage.

3. The transconductor of claim 1, further comprising first and second output terminals coupled to the primary transconductance stage,
   wherein the first transistor is coupled to the first output terminal to provide a first leg of the output current; and
   the second transistor is coupled to the second output terminal to provide a second leg of the output current.

4. The transconductor of claim 1, further comprising first and second input terminals for receiving the input voltage, the first and second input terminals coupled to the primary transconductance stage and the adaptive transconductance stage,
   wherein the third transistor is coupled to the first input terminal to receive a first leg of the input voltage; and
   the fourth transistor is coupled to the second input terminal to receive a second leg of the input voltage.

5. The transconductor of claim 1, wherein the bias circuit comprises:
   a first pair of resistors coupled to the primary transconductance stage to provide the primary bias voltage;
   a second pair of resistors coupled to the adaptive transconductance stage to provide the adaptive bias voltage;
   a first node between the first pair of resistors for receiving a first reference voltage; and
   a second node between the second pair of resistors for receiving a second reference voltage.

6. The transconductor of claim 1, further comprising:
   first and second input terminals;
   wherein
      the first gate terminal is coupled to the first input terminal;
      the second gate terminal is coupled to the second input terminal;
      the third gate terminal is coupled to the first input terminal; and
      the fourth gate terminal is coupled to the second input terminal.

7. The transconductor of claim 6, further comprising:
   first and second output terminals;
   wherein the first drain terminal is coupled to the first output terminal and the second drain terminal is coupled to the second output terminal.

8. The transconductor of claim 6, further including first, second, third, and fourth capacitors, wherein:
   the first and second input terminals are for receiving the input voltage;
   the first gate terminal is coupled to the first input terminal via the first capacitor;
   the second gate terminal is coupled to the second input terminal via the second capacitor;
   the third gate terminal is coupled to the first input terminal via the third capacitor; and
   the fourth gate terminal is coupled to the second input terminal via the fourth capacitor.

9. The transconductor of claim 6, further including first, second, third, and fourth capacitors, wherein:
the first and second input terminals are for receiving the input voltage;
the first gate terminal is coupled to the first input terminal via the first capacitor;
the second gate terminal is coupled to the second input terminal via the second capacitor;
the third gate terminal is coupled to the first input terminal via the third capacitor and the first capacitor; and
the fourth gate terminal is coupled to the second input terminal via the fourth capacitor and the second capacitor.

10. The transconductor of claim 6, further including first, second, third, and fourth capacitors, wherein:
the first and second input terminals are for receiving the input voltage;
the first gate terminal is coupled to the first input terminal via the first and second capacitors;
the second gate terminal is coupled to the second input terminal via the third and fourth capacitors;
the third gate terminal is coupled to the first input terminal via the second capacitor; and
the fourth gate terminal is coupled to the second input terminal via the fourth capacitor.

11. The transconductor of claim 6, further including first, second, third, fourth, fifth, and sixth capacitors, wherein:
the first and second input terminals are for receiving the input voltage;
the first gate terminal is coupled to the first input terminal via the first, second, and third capacitors, wherein the first capacitor is coupled in parallel with the second and third capacitors and the second and third capacitors are in series;
the second gate terminal is coupled to the second input terminal via the fourth, fifth, and sixth capacitors, wherein the fourth capacitor is coupled in parallel with the fifth and sixth capacitors and the fifth and sixth capacitors are in series;
the third gate terminal is coupled to the first input terminal via the first, second, and third capacitors, wherein the third capacitor is coupled in parallel with the first and second capacitors and the first and second capacitors are in series; and
the fourth gate terminal is coupled to the second input terminal via the fourth, fifth, and sixth capacitors, wherein the sixth capacitor is coupled in parallel with the fourth and fifth capacitors and the fourth and fifth capacitors are in series.

12. The transconductor of claim 6, further including first and second capacitors, wherein:
the first and second input terminals are for receiving the input voltage;
the first gate terminal is coupled to the first input terminal directly;
the second gate terminal is coupled to the second input terminal directly;
the third gate terminal is coupled to the first input terminal via the first capacitor; and
the fourth gate terminal is coupled to the second input terminal via the second capacitor.

13. The transconductor of claim 6, wherein the first, second, third, and fourth transistors are NMOS transistors.

14. The transconductor of claim 6, wherein the first, second, third, and fourth transistors are PMOS transistors.

15. The transconductor of claim 1, further comprising a current source coupled to the primary transconductance stage and the adaptive transconductance stage.

16. The transconductor of claim 15, wherein the current source comprises an NMOS transistor.

17. The transconductor of claim 15, wherein the current source comprises a PMOS transistor.

18. A transconductor to convert an input voltage to an output current, the transconductor comprising:
a primary transconductance stage to provide the output current from the input voltage and a driving current;
an adaptive transconductance stage coupled in series with the primary transconductance stage to generate the driving current from the input voltage;
a bias circuit coupled to provide a primary bias voltage to the primary transconductance stage and an adaptive bias voltage to the adaptive transconductance stage; and
a current source coupled to the primary transconductance stage and the adaptive transconductance stage;
wherein the primary transconductance stage includes
a first transistor having a first gate terminal, a first source terminal, and a first drain terminal, and
a second transistor having a second gate terminal, a second source terminal, and a second drain terminal;
wherein the adaptive transconductance stage includes
a third transistor having a third gate terminal, a third source terminal, and a third drain terminal, and
a fourth transistor having a fourth gate terminal, a fourth source terminal, and a fourth drain terminal; and
wherein the first source terminal and the second source terminal are coupled together to the third drain terminal and the fourth drain terminal.

19. The transconductor of claim 18, wherein the primary transconductance stage is coupled to receive the input voltage.

20. The transconductor of claim 18, wherein the adaptive transconductance stage is coupled to receive the input voltage.

* * * * *